(12) United States Patent
Hu (10) Patent No.: US 10,601,146 B2
(45) Date of Patent: Mar. 24, 2020

(54) ANTENNA ELEMENT AND ELECTRONIC DEVICE (71) Applicant: Guangdong Oppo Mobile Telecommunications Corp., Ltd., Dongguan, Guangdong (CN)

(72) Inventor: Shasha Hu, Guangdong (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 90 days.

(21) Appl. No.: 15/725,062

(22) Filed: Oct. 4, 2017

(65) Prior Publication Data

US 2018/0212336 A1 Jul. 26, 2018

(30) Foreign Application Priority Data

Jan. 22, 2017 (CN) .......................... 2017 1 0046071

(51) Int. Cl.
*H01Q 5/30* (2015.01)
*H01Q 5/50* (2015.01)
(Continued)

(52) U.S. Cl.
CPC ............. *H01Q 21/28* (2013.01); *H01Q 1/241* (2013.01); *H01Q 5/328* (2015.01); *H01Q 5/335* (2015.01);
(Continued)

(58) Field of Classification Search
CPC ........ H01Q 1/241; H01Q 1/242; H01Q 1/243; H01Q 1/50; H01Q 5/307; H01Q 5/314;
(Continued)

(56) References Cited

U.S. PATENT DOCUMENTS 6,914,558 B1 7/2005 Shirosaka et al.
6,933,907 B2 * 8/2005 Shirosaka ................ H01Q 1/38
343/810
(Continued)

FOREIGN PATENT DOCUMENTS

CN 103337717 A 10/2013
CN 103928766 A 7/2014
(Continued)

OTHER PUBLICATIONS

International Search Report issued in corresponding international application No. PCT/CN2017/105707 dated Dec. 29, 2017.
(Continued)

*Primary Examiner* — Daniel Munoz
*Assistant Examiner* — Patrick R Holecek
(74) *Attorney, Agent, or Firm* — Young Basile Hanlon & MacFarlane, P.C.

(57) ABSTRACT

An antenna element and an electronic device including the antenna element are provided. The antenna element includes a combiner, a first antenna, a second antenna, a feed, a first connection circuit, a second connection circuit, a first ground circuit, and a second ground circuit. The combiner has a first input terminal electrically connected to the first antenna via the first connection circuit, a second input terminal electrically connected to the second antenna via the second connection circuit, and an output terminal electrically connected to the feed. One end of the first ground circuit is electrically connected to the first antenna. One end of the second ground circuit is electrically connected to the second antenna.

16 Claims, 9 Drawing Sheets (51) Int. Cl.
*H01Q 21/30* (2006.01)
*H01Q 21/28* (2006.01)
*H01Q 5/371* (2015.01)
*H01Q 5/335* (2015.01)
*H01Q 5/328* (2015.01)
*H01Q 5/357* (2015.01)
*H01Q 1/24* (2006.01)
*H05K 1/02* (2006.01)

(52) U.S. Cl.
CPC .............. *H01Q 5/357* (2015.01); *H01Q 5/371* (2015.01); *H01Q 5/50* (2015.01); *H01Q 21/30* (2013.01); *H05K 1/0215* (2013.01); *H01Q 1/243* (2013.01)

(58) Field of Classification Search
CPC ........ H01Q 5/328; H01Q 5/335; H01Q 5/357; H01Q 5/364; H01Q 5/371; H01Q 5/50; H01Q 21/28; H01Q 21/30; H01Q 9/0421; H01Q 1/22; H01Q 1/2258; H01Q 1/2266; H01Q 1/2275; H01Q 1/2291; H01Q 1/24; H01Q 9/04–42; H05K 1/0215; H04B 1/0458; H03H 2/005; H03H 7/461; H03H 7/463; H03H 7/465; H03H 7/468; H03H 7/482; H03H 7/487

See application file for complete search history.

(56) References Cited

U.S. PATENT DOCUMENTS

| | | | |
|---|---|---|---|
| 9,236,657 B2 * | 1/2016 | Nagumo | H01Q 5/335 |
| 9,374,126 B2 * | 6/2016 | Larsen | H01Q 5/314 |
| 9,461,365 B2 * | 10/2016 | Iellici | H01Q 1/2275 |
| 2008/0174508 A1 | 7/2008 | Iwai et al. | |
| 2014/0198009 A1 | 7/2014 | Nagumo et al. | |
| 2014/0375515 A1 * | 12/2014 | Qiu | H01Q 1/243 343/745 |

FOREIGN PATENT DOCUMENTS

| | | |
|---|---|---|
| CN | 104852152 A | 8/2015 |
| CN | 106129627 A | 11/2016 |
| CN | 205985355 U | 2/2017 |
| EP | 0944931 A1 | 9/1999 |
| EP | 2816665 A1 | 12/2014 |
| WO | 9828815 A1 | 7/1998 |

OTHER PUBLICATIONS

Extended European search report issued in corresponding European application No. 17194023.2 dated Apr. 13, 2018.

* cited by examiner

ANTENNA ELEMENT AND ELECTRONIC DEVICE

CROSS-REFERENCE TO RELATED APPLICATION(S)

The present application claims priority to Chinese Patent Application No. 201710046071.9, filed on Jan. 22, 2017, the content of which is hereby incorporated by reference in its entirety.

TECHNICAL FIELD

The present disclosure relates to antenna technology, and more particularly, to an antenna element and an electronic device including the antenna element.

BACKGROUND

With the development of communication technology, an electronic terminal can be required cover broader frequency bands. Due to a limit to the frequency bands supported by a single antenna, an electronic device including the single antenna as designed may not be adaptable to requirements of the developing communication technology.

BRIEF DESCRIPTION OF THE DRAWINGS

The foregoing and/or additional aspects and advantages of the present disclosure will become apparent and better understood from the following description of the implementations taken in conjunction with the accompanying drawings.

DETAILED DESCRIPTION

Detailed implementations of the present disclosure are disclosed herein, and examples of the implementations are shown in the drawings in which identical or similar characters represent identical or similar parts or parts having identical or similar functions throughout. The implementations described with reference to the drawings below are merely exemplary for the purpose of explaining the present disclosure, and are not intended to limit the present disclosure.

Many different implementations or examples for achieving different structures of the present disclosure are provided hereinafter. To simplify the present disclosure, the components and arrangements of specific examples are described below. These components and arrangements are merely exemplary, and are not to be construed as a limit to the present disclosure. In addition, the reference numbers and/or letters may be repeated in the different examples of the present disclosure. Such repetition is for the purpose of simplification and clarity, without indicating relationships between the discussed various implementations and/or arrangements. Moreover, the present disclosure provides examples of various specific processes and materials, but the application of other processes and/or other materials may be appreciated by persons skilled in the art.

Figure 1:
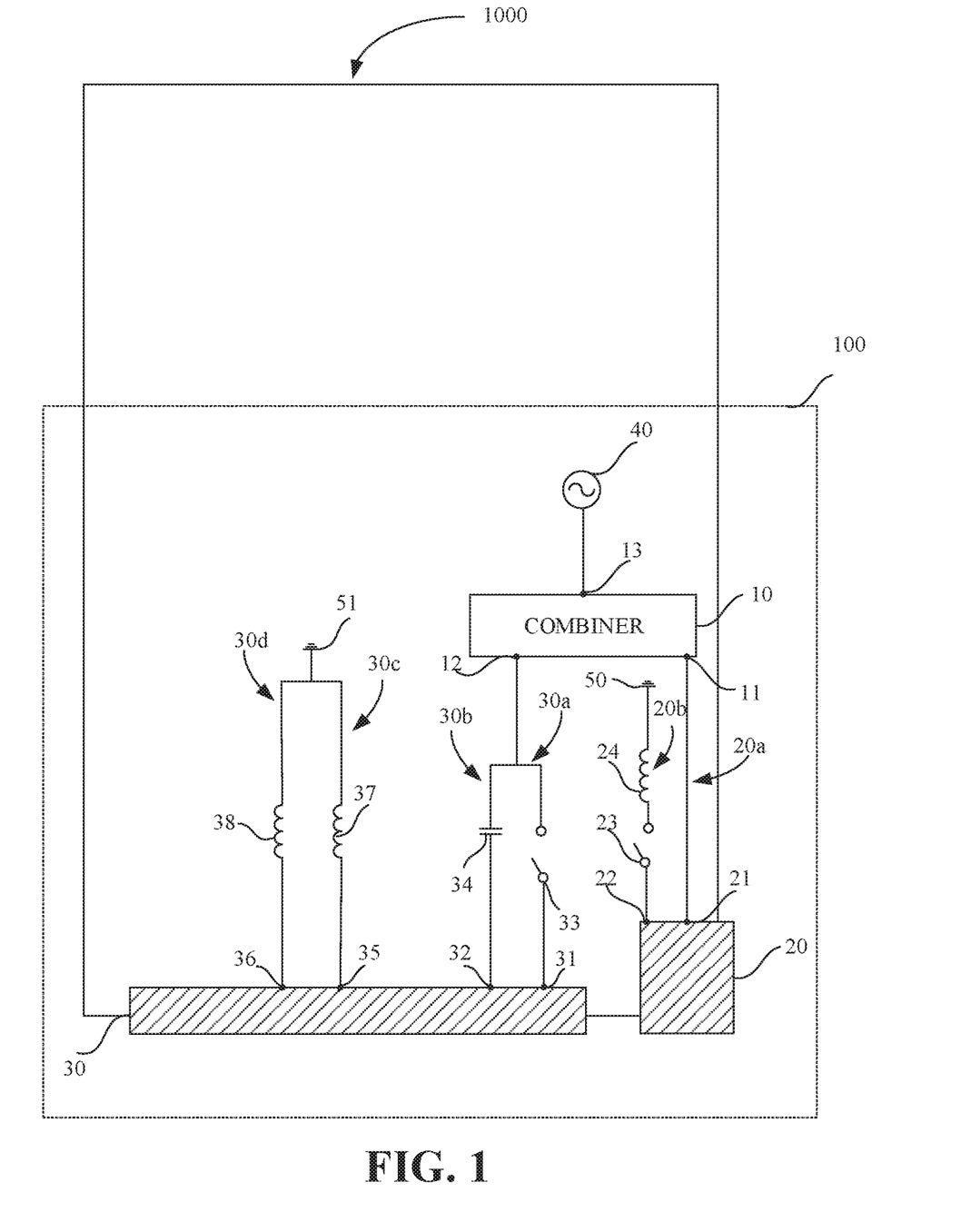
FIG. 1 is a schematic diagram of an antenna element according to an implementation of the present disclosure.

FIGS. 1 to 5 show an antenna element according to an implementation of the present disclosure. As illustrated in FIG. 1, an antenna element 100 according to an implementation of the present disclosure includes a combiner 10, a first antenna 20, a second antenna 30, a feed 40, a first connection circuit 20a, a second connection circuit including a first connection sub-circuit 30a and a second connection sub-circuit 30b, a first ground circuit 20b, and a second ground circuit including a first ground sub-circuit 30c and a second ground sub-circuit 30d.

The combiner 10 includes a first input terminal 11, a second input terminal 12, and an output terminal 13. The first input terminal 11 is electrically connected to the first antenna 20, for example, to a first contact 21 of the first antenna 20, via the first connection circuit 20a.

One end of the first ground circuit 20b is electrically connected to the first antenna 20, for example, to a second contact 22 of the first antenna 20.

The second input terminal 12 of the combiner 10 is electrically connected to the second antenna 30, for example, to a third contact 31 and a fourth contact 32 of the second antenna 30, via the second connection circuit.

One end of the first ground sub-circuit 30c is electrically connected to the second antenna 30, for example, to a fifth contact 35 and a sixth contact 36 of the second antenna 30.

The output terminal 13 of the combiner 10 is electrically connected to the feed 40.

The antenna element 100 according to an implementation of the present disclosure may be applied to an electronic device 1000 according to an implementation of the present disclosure. In other words, the electronic device 1000 includes the antenna element 100.

In some implementations, the first antenna 20 covers a frequency range of 1710 MHz to 2700 MHz, while the second antenna 30 covers a frequency range of 700 MHz to 960 MHz. In this way, the first antenna 20 covers a high-frequency band, while the second antenna 30 covers a low-frequency band, so as to cover broader frequency bands and meet requirements from users.

It may be appreciated that, a dual-antenna structure is adopted in the antenna element 100 according to an implementation of the present disclosure, so as to cover multiple frequency bands, such as the high-frequency band, the low-frequency band, and so on, thereby solving the problem of insufficient low-frequency bandwidth. Free switch among multiple frequency bands can be achieved with at least one component (such as a switch, an inductor or a capacitor) in the connection circuits between the antenna and the combiner 10, thereby improving the lower frequency band performance of the antenna device and achieving higher adjustment flexibility.

As illustrated in FIG. 1, the first connection circuit 20a electrically interconnects the first input terminal 11 of the combiner 10 and the first contact 21 of the first antenna 20.

The first ground circuit 20b includes a first ground terminal 50, a first inductor 24, and a first switch 23. The first ground terminal 50, the first inductor 24, the first switch 23, and the second contact 22 are electrically connected in series.

The first connection sub-circuit 30a and the second connection sub-circuit 30b are electrically connected in parallel.

The first connection sub-circuit 30a includes a second switch 33. The second input terminal 12, the second switch 33, and a third contact 31 are electrically connected in series.

The second connection sub-circuit 30b includes a capacitor 34. The second input terminal 12, the capacitor 34, and the fourth contact 32 are electrically connected in series.

The first ground sub-circuit 30c and the second ground sub-circuit 30d are electrically connected in parallel.

The first ground sub-circuit 30c includes a second ground terminal 51 and a second inductor 37. The second ground terminal 51, the second inductor 37, and the fifth contact 35 are electrically connected in series.

The second ground sub-circuit 30d includes the second ground terminal 51 and a third inductor 38. The second ground terminal 51, the third inductor 38, and the sixth contact 36 are electrically connected in series.

Figure 2:
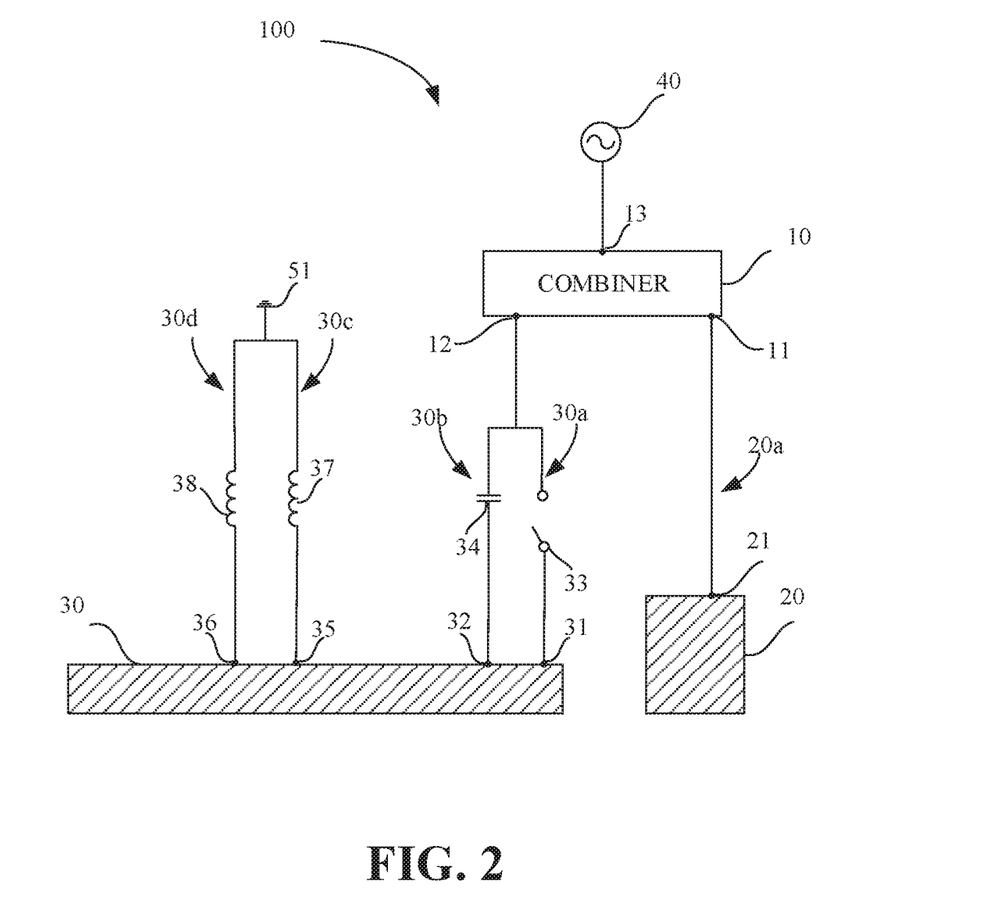
FIG. 2 is a schematic diagram of an antenna element according to an implementation of the present disclosure.
Figure 3:
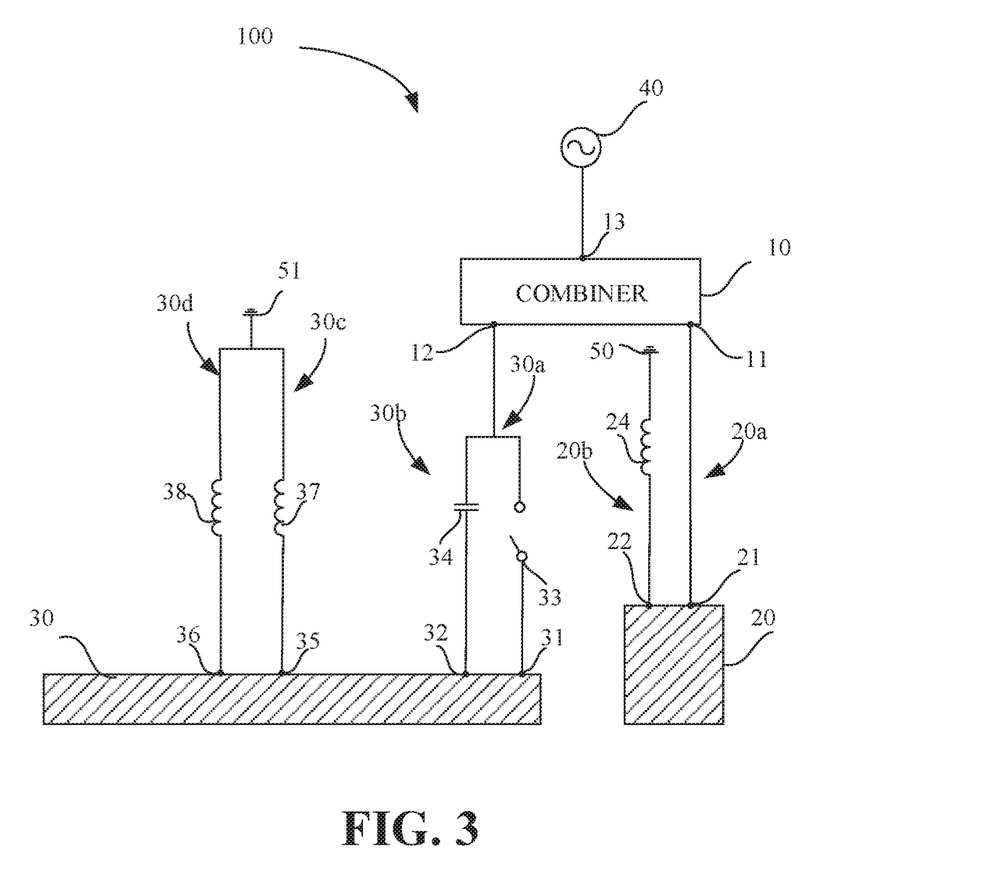
FIG. 3 is a schematic diagram of an antenna element according to an implementation of the present disclosure.

As illustrated in FIG. 2, when the first switch 23 is opened, the first ground circuit 20b fails to establish electrical communication between the first ground terminal 50 and the second contact 22, such that the first inductor 24 does not function. In this case, the first antenna 20 covers a frequency band of 2300 MHz to 2700 MHz. Accordingly, the frequency bands covered by the antenna element 100 includes the frequency band of 2300 MHz to 2700 MHz. As illustrated in FIG. 3, when the first switch 23 is closed, the first ground circuit 20b establishes electrical communication between the first ground terminal 50 and the second contact 22, such that the first inductor 24 functions. In this case, the first antenna 20 covers a frequency band of 1710 MHz to 2170 MHz. Accordingly, the frequency bands covered by the antenna element 100 includes the frequency band of 1710 MHz to 2170 MHz. A resonance length of the first antenna 20 can be adjusted with the first inductor 24 of the first ground circuit 20b, thereby changing the frequency band covered by the first antenna 20.

In some implementations, the first inductor 24 may have an inductance value ranged from 1 nH to 4 nH. In other implementations, the inductance value of the first inductor 24 may be 1 nH, 1.5 nH, 3 nH, 4 nH, or the like. In this way, the frequency band covered by the first antenna 20 can be adjusted by adjusting the inductance value of the first inductor 24.

Figure 4:
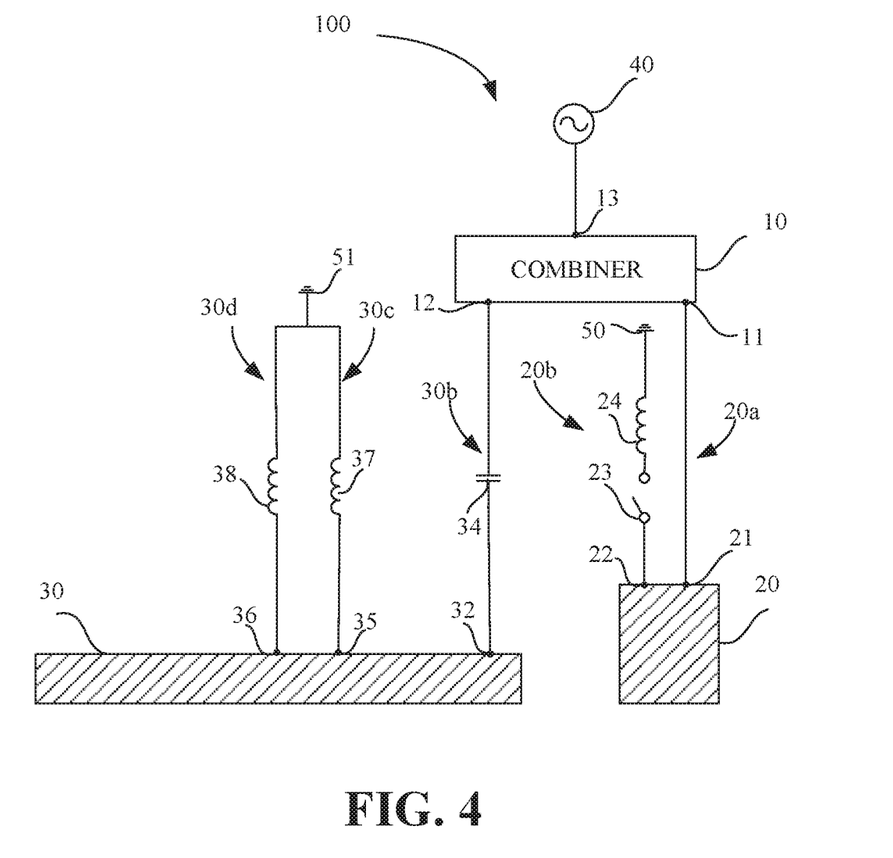
FIG. 4 is a schematic diagram of an antenna element according to an implementation of the present disclosure.
Figure 5:
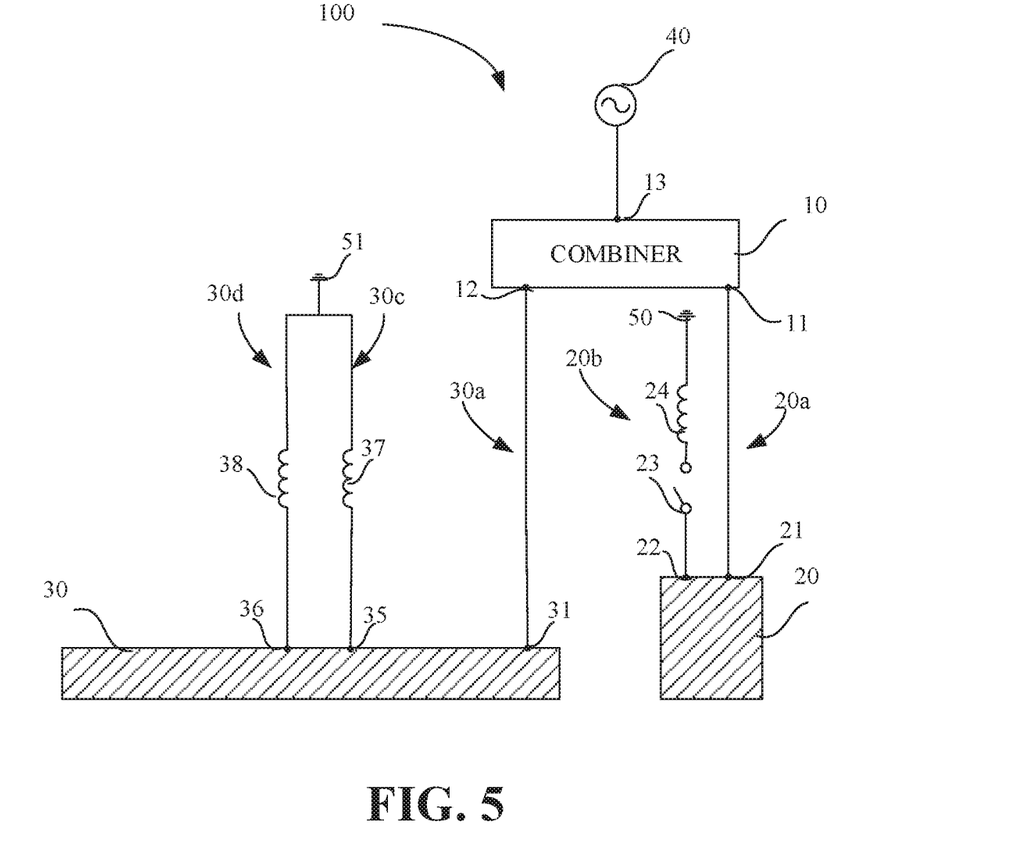
FIG. 5 is a schematic diagram of an antenna element according to an implementation of the present disclosure.

As illustrated in FIG. 4, when the second switch 33 is opened, the first connection sub-circuit 30a fails to establish electrical communication between the second input terminal 12 and the third contact 31. In this case, the second connection sub-circuit 30b establishes electrical communication between the second input terminal 12 and the fourth contact 32 such that the capacitor 34 functions, and the second antenna 30 covers a frequency band of 700 MHz to 800 MHz. Accordingly, the frequency bands covered by the antenna element 100 includes the frequency band of 700 MHz to 800 MHz. As illustrated in FIG. 5, when the second switch 33 is closed, the first connection sub-circuit 30a establishes electrical communication between the second input terminal 12 and the third contact 31. In this case, the second connection sub-circuit 30b fails to establish electrical communication between the second input terminal 12 and the fourth contact 32 such that the capacitor 34 does not function, and the second antenna 30 covers a frequency band of 800 MHz to 960 MHz. Accordingly, the frequency bands covered by the antenna element 100 includes the frequency band of 800 MHz to 960 MHz. A resonance length of the second antenna 30 can be adjusted with the capacitor 34 of the second connection sub-circuit 30b, thereby changing the frequency band covered by the second antenna 30.

In some implementations, the capacitor 34 may have a capacitance value ranged from 1 pF to 4 pF. In other implementations, the capacitance value of the capacitor 34 may be 1 pF, 2 pF, 3.5 pF, 4 pF, or the like. In this way, the frequency band covered by the second antenna 30 can be adjusted by adjusting the capacitance value of the capacitor 34.

The frequency bands which can be covered by the antenna element 100 include the frequency bands which can be covered by the first antenna 20 and the frequency bands which can be covered by the second antenna 30. For example, when both the first switch 23 and the second switch 33 are opened, the antenna element 100 covers the frequency band of 2300 MHz to 2700 MHz and the frequency band of 700 MHz to 800 MHz. When the first switch 23 is opened and the second switch 33 is closed, the antenna element 100 covers the frequency band of 2300 MHz to 2700 MHz and the frequency band of 800 MHz to 960 MHz. When both the first switch 23 and the second switch 33 are closed, the antenna element 100 covers the frequency band of 1710 MHz to 2170 MHz and the frequency band of 800 MHz to 960 MHz. When the first switch 23 is closed and the second switch 33 is opened, the antenna element 100 covers the frequency band of 1710 MHz to 2170 MHz and the frequency band of 700 MHz to 800 MHz. It should be noted that, the first antenna 20 and the second antenna 30 are independent of each other. Therefore, the electrical communication established by the first antenna 20 doesn't impact on the second antenna 30. Similarly, the electrical communication established by the second antenna 30 doesn't impact on the first antenna 20.

In this way, the antenna element 100 can cover a plurality of the frequency bands, such as 700 MHz to 800 MHz, 800 MHz to 960 MHz, 1710 MHz to 2170 MHz, 2300 MHz to 2700 MHz, and so on, thereby broadening the frequency bandwidth and achieving higher adjustment flexibility.

Figure 6:
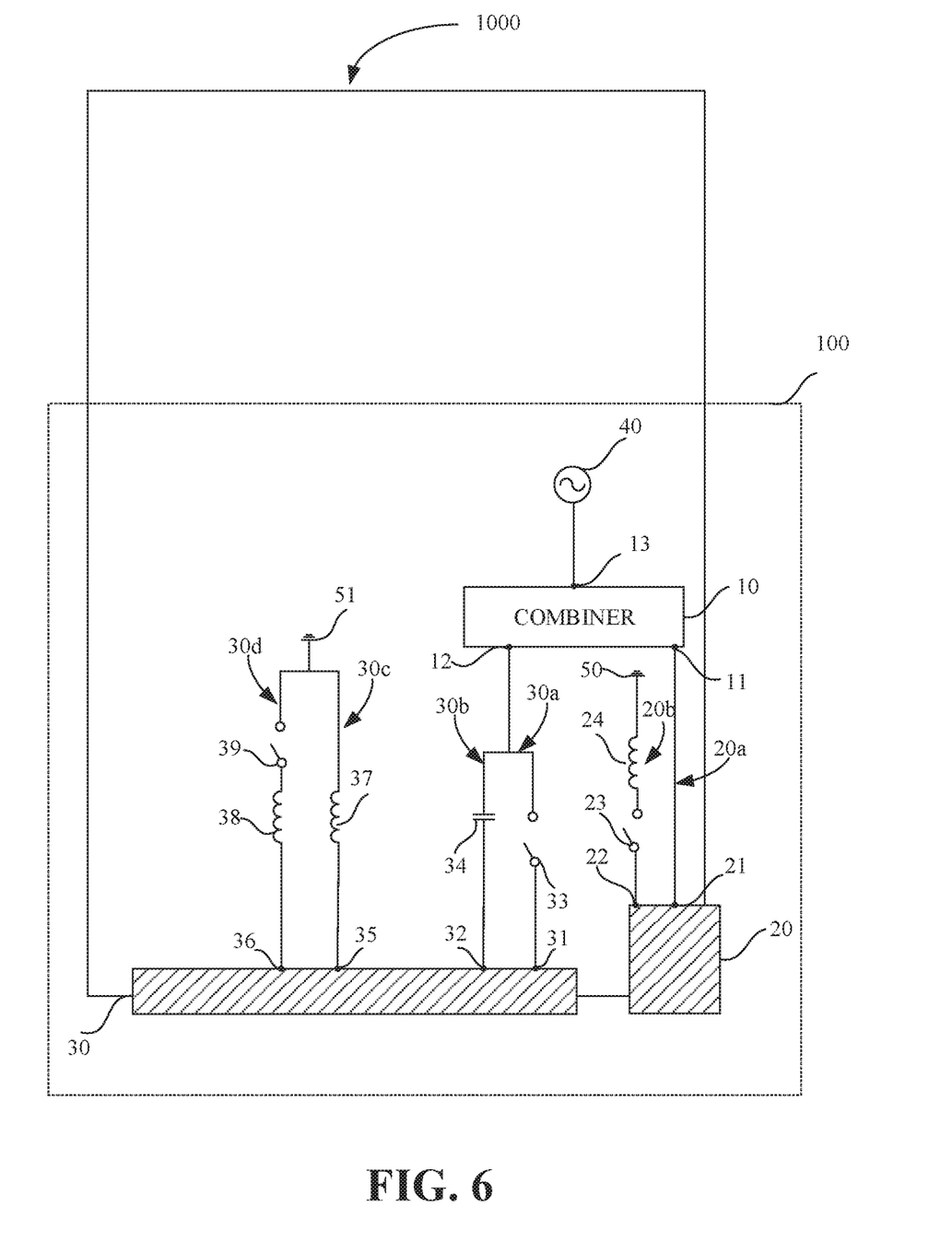
FIG. 6 is a schematic diagram of an electronic device according to another implementation of the present disclosure.
Figure 7:
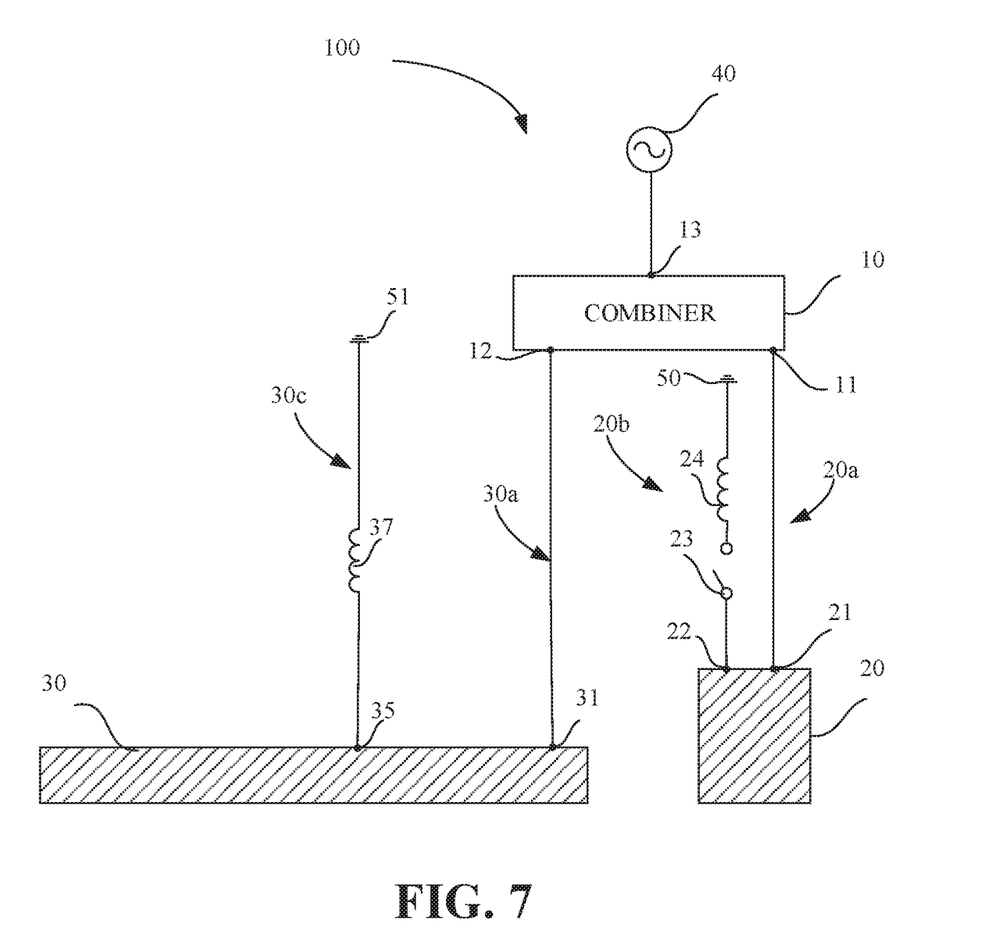
FIG. 7 is a schematic diagram of an antenna element according to another implementation of the present disclosure.
Figure 8:
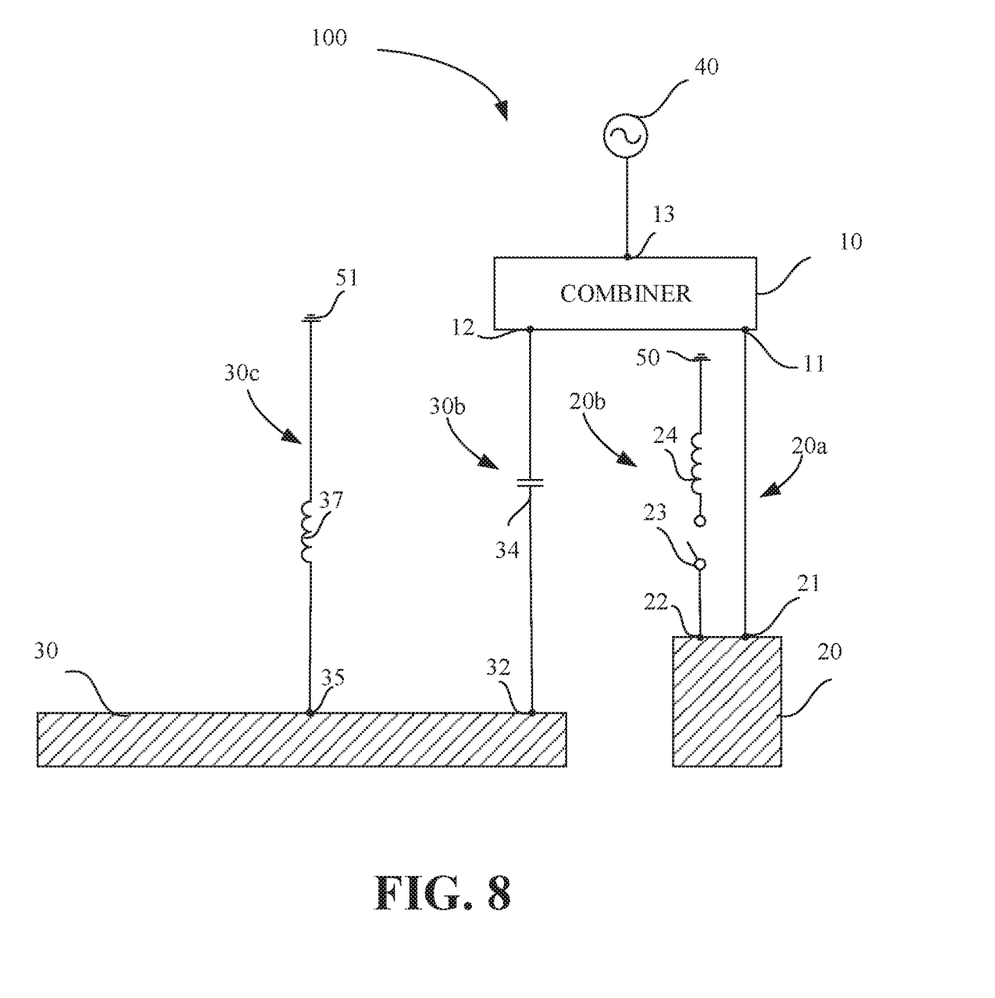
FIG. 8 is a schematic diagram of an antenna element according to another implementation of the present disclosure.

FIGS. 6 to 8 show an antenna element according to another implementation of the present disclosure. As illustrated in FIG. 6, in order to improve the adjustment flexibility of the antenna element 100, the second ground sub-circuit 30d further includes a third switch 39. The second ground terminal 51, the third switch 39, the third inductor 38, and the sixth contact 36 of the second antenna 30 are electrically connected in series.

As illustrated in FIG. 7, when the second switch 33 is closed and the third switch 39 is opened, the first connection sub-circuit 30a establishes electrical communication between the second input terminal 12 and the third contact 31, and the second ground sub-circuit 30d fails to establish electrical communication between the second ground terminal 51 and the sixth contact 36. In this case, the antenna element 100 covers a frequency band of 800 MHz to 894 MHz. When both the second switch 33 and the third switch 39 are closed, the first connection sub-circuit 30a establishes electrical communication between the second input terminal 12 and the third contact 31, and the second ground sub-circuit 30d establishes electrical communication between the second ground terminal 51 and the sixth contact 36. In this case, the antenna element 100, as illustrated in FIG. 5, covers a frequency band of 880 MHz to 960 MHz. When the second switch 33 is opened, the first connection sub-circuit 30a fails to establish electrical communication between the second input terminal 12 and the third contact 31. In this case, the antenna element 100, as illustrated in FIG. 4 or FIG. 8, covers a frequency band of 700 MHz to 800 MHz. In this case, the frequency band of 700 MHz to 800 MHz covered by the antenna element 100 can be further accurately adjusted by means of opening or closing the third switch 39 in the second ground sub-circuit 30d and adjusting the inductance values of the second inductor 37 and the third inductor 38.

In some implementations, the second inductor 37 may have an inductance value ranged from 6 nH to 10 nH. In other implementations, the inductance value of the second inductor 37 may be 6 nH, 7 nH, 8.5 nH, 10 nH, or the like.

In some implementations, the third inductor 38 may have an inductance value ranged from 1 nH to 4 nH. In other implementations, the inductance value of the third inductor 38 may be 1 nH, 2 nH, 3 nH, 3.4 nH, 4 nH, or the like.

The frequency bands which can be covered by the antenna element 100 include the frequency bands which can be covered by the first antenna 20 and the frequency bands which can be covered by the second antenna 30. Thus, when the third switch 39 is further disposed and the first switch 23, the second switch 33, and the third switch 39 are all opened, the antenna element 100 covers the frequency band of 2300 MHz to 2700 MHz and the frequency band of 700 MHz to 800 MHz. When the first switch 23 and the second switch 33 are opened and the third switch 39 is closed, the antenna element 100 covers the frequency band of 2300 MHz to 2700 MHz and the frequency band of 800 MHz to 960 MHz. When the first switch 23 and the third switch 39 are opened and the second switch 33 is closed, the antenna element 100 covers the frequency band of 2300 MHz to 2700 MHz and the frequency band of 800 MHz to 894 MHz. When the first switch 23 is opened and the third switch 39 and the second switch 33 are closed, the antenna element 100 covers the frequency band of 2300 MHz to 2700 MHz and the frequency band of 880 MHz to 960 MHz. When the first switch 23, the third switch 39, and the second switch 33 are all closed, the antenna element 100 covers the frequency band of 1710 MHz to 2170 MHz and the frequency band of 880 MHz to 960 MHz. When the first switch 23 and the second switch 33 are closed and the third switch 39 is opened, the antenna element 100 covers the frequency band of 1710 MHz to 2170 MHz and the frequency band of 800 MHz to 894 MHz. When the first switch 23 and the third switch 39 are closed and the second switch 33 is opened, the antenna element 100 covers the frequency band of 1710 MHz to 2170 MHz and the frequency band of 700 MHz to 800 MHz. When the first switch 23 is closed and the second switch 33 and the third switch 39 are opened, the antenna element 100 covers the frequency band of 1710 MHz to 2170 MHz and the frequency band of 700 MHz to 800 MHz.

In this way, by means of disposing the third switch 39, the antenna element 100 can cover a plurality of the frequency bands of 700 MHz to 800 MHz, 800 MHz to 894 MHz, 800 MHz to 960 MHz, 1710 MHz to 2170 MHz, 2300 MHz to 2700 MHz, and so on. Although the second antenna 30 can cover the frequency band of 800 MHz to 960 MHz without disposing the third switch 39, in this case, strong standing waves are produced at the second antenna 30, thereby rendering the performance of the second antenna 30 bad. However, by means of disposing the third switch 39, on one hand, free switch between the two frequency bands of 800 MHz to 894 MHz and 800 MHz to 960 MHz can be achieved; On the other hand, the standing waves at the second antenna 30 can be reduced, and thus the performance of the second antenna 30 can be improved. In addition, the frequency band of 700 MHz to 800 MHz can be more accurately adjusted by adjusting the inductance values of the second inductor 37 and the third inductor 38. Therefore, the adjustment flexibility of the antenna element 100 can be further improved.

In some implementations, the first antenna 20 and the second antenna 30 may be flexible printed circuit (FPC) antennas. The FPC antennas have light weights, small sizes, small thickness, and are highly flexible such that the FPC antennas can be bent, even folded, for many times. The FPC antennas can further facilitate mass production, simplify manufacturing processes of the antennas, and reduce manufacturing costs.

Figure 9:
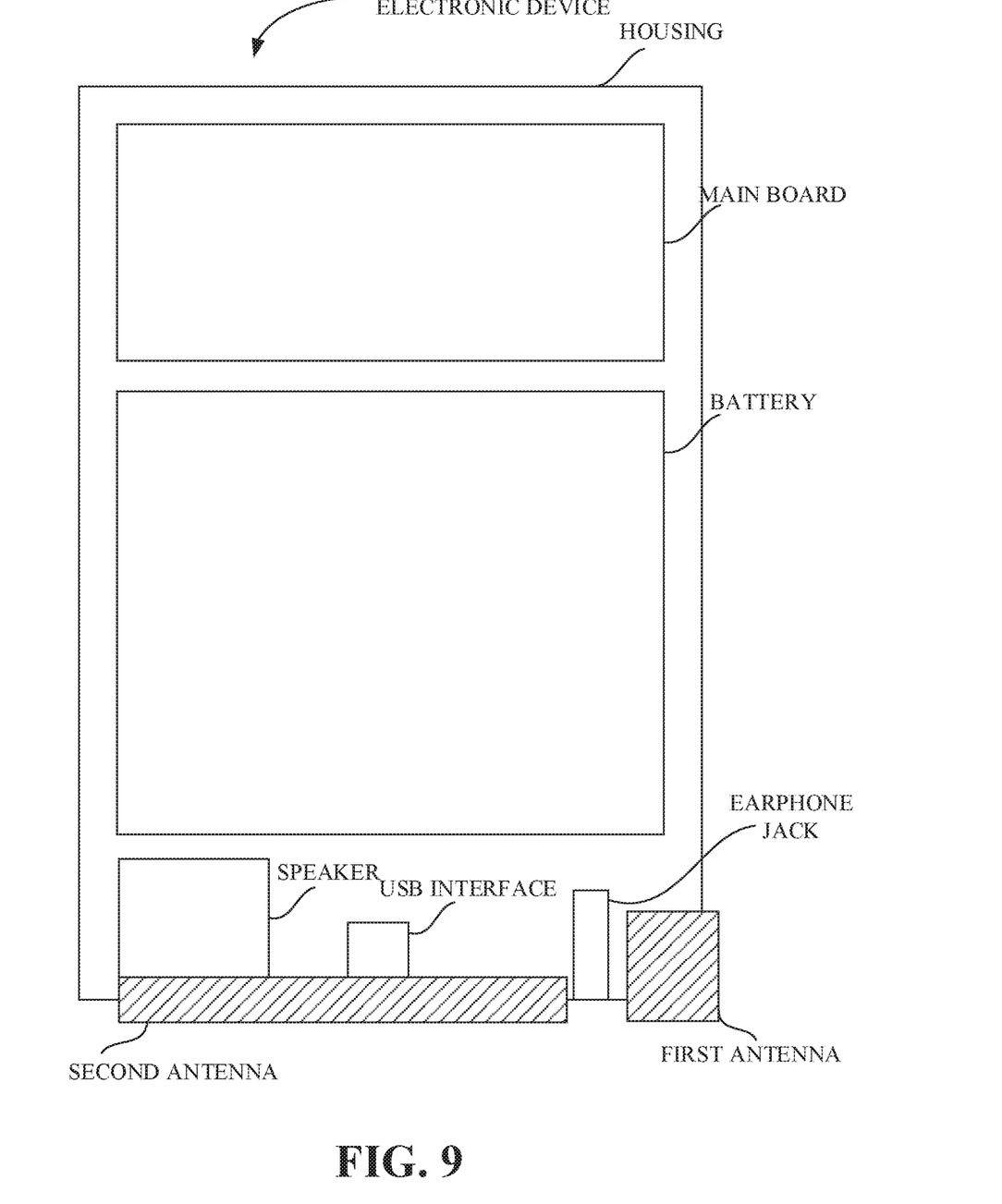
FIG. 9 is a diagram of an electronic device according to an implementation of the present disclosure.

FIG. 9 shows an electronic device according to an implementation of the present disclosure. The electronic device may be a mobile phone. As illustrated in FIG. 9, an electronic device 1000 includes the first antenna 20, the second antenna 30, a battery, a main board, an earphone jack, a USB interface, a speaker and a housing. The first antenna 20 and the second antenna 30 are built-in antennas. The housing is configured to receive the antenna element 100 which is placed in the bottom of the mobile phone, and the first antenna 20 and the second antenna 30 are flexible printed circuit antennas attached to an inner surface of the housing.

The antenna element 100 and the electronic device 1000 according to the implementations of the present disclosure can cover the concerned frequency bands for a plurality of communication technologies, such as global system for mobile communication (GSM), time division-synchronization code division multiple access (TD-SCDMA), time division long term evolution (TD-LTE), and achieves free switch among the low frequency bands by means of a plurality of switches, thereby broadening the frequency bandwidth and improving the adjustment flexibility.

In the present disclosure, unless specified otherwise, the terms "mount", "connect", "couple", "fix", and the like should be broadly understood, and may include, for example, an undetachable connection, a detachable connection, an integral connection, a mechanical connection, an electrical connection, a direct connection, an indirect connection via an intermediate medium, a communication between two elements, and an interactive relationship between two elements. For persons skilled in the art, the specific meaning of the foregoing terms in the present disclosure should be understood in light of the specific circumstance.

In the description of the specification, description for terms, such as "one implementation", "some implementations", "an exemplary implementation", "an example", "an embodiment", "some examples", or the like is intended to mean that specific features, structures, materials, or characteristics described in conjunction with the implementations or examples are included in at least one implementation or example of the present disclosure. In this specification, the exemplary description for the above-mentioned terms does not necessarily refer to the same implementations or examples. Moreover, the described specific features, structures, materials, or characteristics may be combined appropriately in any one or more implementations or examples.

Although the implementations of the present disclosure have been illustrated and described, it should be understood by persons skilled in the art that various changes, modifications, substitutions, and variations could be made to these implementations without departing from the principles and spirit of the present disclosure. The scope of the present disclosure is defined by claims and equivalents thereof.

What is claimed is:

1. An antenna element, comprising:
a combiner, a first antenna, a second antenna, a feed, a first connection circuit, a second connection circuit, a first ground circuit, and a second ground circuit, wherein
the first antenna comprises a first contact and a second contact, the second antenna comprises a first connecting portion and a second connecting portion;
the combiner comprises a first input terminal electrically connected to the first contact of the first antenna via the first connection circuit, a second input terminal electrically connected to the first connecting portion of the second antenna via the second connection circuit, and an output terminal electrically connected to the feed;
the first ground circuit is electrically connected between the second contact of the first antenna and ground; and
the second ground circuit is electrically connected between the second connecting portion of the second antenna and ground;
wherein the first ground circuit comprises a first switch electrically connected between the first contact of the first antenna and ground, and the first antenna is able to cover different frequency bands by switching an on-off state of the first switch;
wherein the first ground circuit further comprises a first ground terminal and a first inductor, wherein the first ground terminal, the first inductor, the first switch, and the first antenna are electrically connected in series;
wherein the first inductor has an inductance value ranged from 1 nH to 4 nH;
when the first switch is switched off, the first ground circuit fails to establish electrical communication between the first ground terminal and the first antenna, and the first antenna covers a frequency band of 2300 MHz to 2700 MHz;
when the first switch is switched on, the first ground circuit establishes electrical communication between the first ground terminal and the first antenna, and the first antenna covers a frequency band of 1710 MHz to 2170 MHz.

2. The antenna element of claim 1, wherein the second connection circuit comprises a first connection sub-circuit and a second connection sub-circuit which are electrically connected in parallel between the first connecting portion of the second antenna and the second input terminal of the combiner; wherein the first connection sub-circuit comprises a second switch electrically connected between the second antenna and the second input terminal, and the second antenna is able to cover different frequency bands by switching an on-off state of the second switch.

3. The antenna element of claim 2, wherein
the second input terminal, the second switch, and the second antenna are electrically connected in series; and
the second connection sub-circuit comprises a capacitor, wherein the second input terminal, the capacitor, and the second antenna are electrically connected in series.

4. The antenna element of claim 3, wherein
the second ground circuit comprises a first ground sub-circuit and a second ground sub-circuit which are electrically connected in parallel;
the first ground sub-circuit comprises a second ground terminal and a second inductor, wherein the second ground terminal, the second inductor, and the second antenna are electrically connected in series; and
the second ground sub-circuit comprises the second ground terminal and a third inductor, wherein the second ground terminal, the third inductor, and the second antenna are electrically connected in series.

5. The antenna element of claim 4, wherein the capacitor has a capacitance value ranged from 1 pF to 4 pF, the second inductor has an inductance value ranged from 6 nH to 10 nH, and the third inductor has an inductance value ranged from 1 nH to 4 nH.

6. The antenna element of claim 5, wherein
when the second switch is switched off, the first connection sub-circuit fails to establish electrical communication between the second input terminal and the second antenna, while the second connection sub-circuit establishes electrical communication between the second input terminal and the second antenna, and the second antenna covers a frequency band of 700 MHz to 800 MHz;
when the second switch is switched on, the first connection sub-circuit establishes electrical communication between the second input terminal and the second antenna, while the second connection sub-circuit fails to establish electrical communication between the second input terminal and the second antenna, and the second antenna covers a frequency band of 800 MHz to 960 MHz.

7. The antenna element of claim 5, wherein the second ground sub-circuit further comprises a third switch, wherein the second ground terminal, the third switch, the third inductor, and the second antenna are electrically connected in series; wherein the second antenna is able to cover different frequency bands by switching on-off states of the second switch and the third switch.

8. The antenna element of claim 7, wherein
when the second switch is switched on and the third switch is switched off, the first connection sub-circuit establishes electrical communication between the second input terminal and the second antenna, the first ground sub-circuit establishes electrical communication between the second ground terminal and the second antenna, and the second antenna covers a frequency band of 800 MHz to 894 MHz;
when both the second switch and the third switch are switched on, the first connection sub-circuit establishes electrical communication between the second input terminal and the second antenna, the second ground sub-circuit establishes electrical communication between the second ground terminal and the second antenna, and the second antenna covers a frequency band of 880 MHz to 960 MHz;
when the second switch is switched off and the third switch is switched on, the second connection sub-circuit establishes electrical communication between the second input terminal and the second antenna, and the second antenna covers a frequency band of 700 MHz to 800 MHz;
when both the second switch and the third switch are switched off, the second connection sub-circuit establishes electrical communication between the second input terminal and the second antenna, the first ground sub-circuit establishes electrical communication between the second ground terminal and the second antenna, and the second antenna covers a frequency band of 700 MHz to 800 MHz.

9. An electronic device, comprising:
an antenna element and a housing configured to receive the antenna element, wherein the antenna element comprises a combiner, a first antenna, a second antenna, a feed, a first connection circuit, a second connection circuit, a first ground circuit, and a second ground circuit, wherein the first antenna comprises a first contact and a second contact, the second antenna comprises a first connecting portion and a second connecting portion;

the combiner comprises a first input terminal electrically connected to the first contact of the first antenna via the first connection circuit, a second input terminal electrically connected to the first connecting portion of the second antenna via the second connection circuit, and an output terminal electrically connected to the feed;

the first ground circuit is electrically connected between the second contact of the first antenna and ground; and the second ground circuit is electrically connected between the second connecting portion of the second antenna and ground;

wherein the first ground circuit comprises a first switch electrically connected between the first contact of the first antenna and ground, and the first antenna is able to cover different frequency bands by switching an on-off state of the first switch;

wherein the first ground circuit further comprises a first ground terminal and a first inductor, wherein the first ground terminal, the first inductor, the first switch, and the first antenna are electrically connected in series;

wherein the first inductor has an inductance value ranged from 1 nH to 4 nH;

when the first switch is switched off, the first ground circuit fails to establish electrical communication between the first ground terminal and the first antenna, and the first antenna covers a frequency band of 2300 MHz to 2700 MHz;

when the first switch is switched on, the first ground circuit establishes electrical communication between the first ground terminal and the first antenna, and the first antenna covers a frequency band of 1710 MHz to 2170 MHz.

10. The electronic device of claim 9, wherein the second connection circuit comprises a first connection sub-circuit and a second connection sub-circuit which are electrically connected in parallel between the first connecting portion of the second antenna and the second input terminal of the combiner;

the first connection sub-circuit comprises a second switch electrically connected between the second antenna and the second input terminal, and the second antenna is able to cover different frequency bands by switching an on-off state of the second switch.

11. The electronic device of claim 10, wherein the second ground circuit comprises a first ground sub-circuit and a second ground sub-circuit which are electrically connected in parallel;

the first ground sub-circuit comprises a second ground terminal and a second inductor, wherein the second ground terminal, the second inductor, and the second antenna are electrically connected in series; and the second ground sub-circuit comprises the second ground terminal and a third inductor, wherein the second ground terminal, the third inductor, and the second antenna are electrically connected in series.

12. The electronic device of claim 11, wherein the second ground sub-circuit further comprises a third switch, wherein the second ground terminal, the third switch, the third inductor, and the second antenna are electrically connected in series; wherein the second antenna is able to cover different frequency bands by switching on-off states of the second switch and the third switch.

13. An antenna element, comprising:

a combiner, a first antenna, a second antenna, a feed, a first connection circuit, a second connection circuit, a first ground circuit, and a second ground circuit, wherein the first antenna comprises a first contact and a second contact, the second antenna comprises a first connecting portion and a second connecting portion;

the combiner comprises a first input terminal electrically connected to the first contact of the first antenna via the first connection circuit, a second input terminal electrically connected to the first connecting portion of the second antenna via the second connection circuit, and an output terminal electrically connected to the feed;

the first ground circuit is electrically connected between the second contact of the first antenna and ground; and the second ground circuit is electrically connected between the second connecting portion of the second antenna and ground;

wherein the second ground circuit comprises a first ground sub-circuit and a second ground sub-circuit which are electrically connected in parallel, wherein the first ground sub-circuit comprises a second ground terminal and a second inductor, wherein the second ground terminal, the second inductor, and the second antenna are electrically connected in series; and the second ground sub-circuit comprises the second ground terminal, a third switch, and a third inductor, wherein the second ground terminal, the third switch, the third inductor, and the second antenna are electrically connected in series; wherein the second antenna is able to cover different frequency bands by switching on-off states of the second switch and the third switch, wherein the first ground circuit comprises a first switch electrically connected between the first contact of the first antenna and ground, and the first antenna is able to cover different frequency bands by switching an on-off state of the first switch;

wherein the first ground circuit further comprises a first ground terminal and a first inductor, wherein the first ground terminal, the first inductor, the first switch, and the first antenna are electrically connected in series;

wherein the first inductor has an inductance value ranged from 1 nH to 4 nH;

when the first switch is switched off, the first ground circuit fails to establish electrical communication between the first ground terminal and the first antenna, and the first antenna covers a frequency band of 2300 MHz to 2700 MHz;

when the first switch is switched on, the first ground circuit establishes electrical communication between the first ground terminal and the first antenna, and the first antenna covers a frequency band of 1710 MHz to 2170 MHz.

14. The antenna element of claim 13, wherein the second connection circuit comprises a first connection sub-circuit and a second connection sub-circuit which are electrically connected in parallel between the first connecting portion of the second antenna and the second input terminal of the combiner; wherein the first connection sub-circuit comprises a second switch electrically connected between the second antenna and the second input terminal, and the second antenna is able to cover different frequency bands by switching an on-off state of the second switch.

15. The antenna element of claim 14, wherein
the second input terminal, the second switch, and the second antenna are electrically connected in series; and
the second connection sub-circuit comprises a capacitor, wherein the second input terminal, the capacitor, and the second antenna are electrically connected in series.

16. The antenna element of claim 15, wherein
when the second switch is switched on and the third switch is switched off, the first connection sub-circuit establishes electrical communication between the second input terminal and the second antenna, the first ground sub-circuit establishes electrical communication between the second ground terminal and the second antenna, and the second antenna covers a frequency band of 800 MHz to 894 MHz;

when both the second switch and the third switch are switched on, the first connection sub-circuit establishes electrical communication between the second input terminal and the second antenna, the second ground sub-circuit establishes electrical communication between the second ground terminal and the second antenna, and the second antenna covers a frequency band of 880 MHz to 960 MHz;

when the second switch is switched off and the third switch is switched on, the second connection sub-circuit establishes electrical communication between the second input terminal and the second antenna, and the second antenna covers a frequency band of 700 MHz to 800 MHz;

when both the second switch and the third switch are switched off, the second connection sub-circuit establishes electrical communication between the second input terminal and the second antenna, the first ground sub-circuit establishes electrical communication between the second ground terminal and the second antenna, and the second antenna covers a frequency band of 700 MHz to 800 MHz.

* * * * *